United States Patent
Kayanakis

(10) Patent No.: US 6,786,419 B2
(45) Date of Patent: Sep. 7, 2004

(54) CONTACTLESS SMART CARD WITH AN ANTENNA SUPPORT AND A CHIP SUPPORT MADE OF FIBROUS MATERIAL

(75) Inventor: Georges Kayanakis, Antibes (FR)

(73) Assignee: Ask S.A., Valbonne (FR)

(*) Notice: Subject to any disclaimer, the term of this patent is extended or adjusted under 35 U.S.C. 154(b) by 0 days.

(21) Appl. No.: 10/170,446

(22) Filed: Jun. 14, 2002

(65) Prior Publication Data

US 2002/0190132 A1 Dec. 19, 2002

(30) Foreign Application Priority Data

Jun. 14, 2001 (FR) .............................. 01 07782

(51) Int. Cl.⁷ .............................................. G06K 19/06
(52) U.S. Cl. ...................................... 235/492; 235/487
(58) Field of Search .................................. 235/492, 487; 257/679; 428/195

(56) References Cited

U.S. PATENT DOCUMENTS

| 5,888,624 | A | * | 3/1999 | Haghiri et al. ............ 428/195 |
| 5,898,215 | A | * | 4/1999 | Miller et al. ............... 257/679 |
| 6,281,048 | B1 | | 8/2001 | Vere et al. .................. 438/118 |
| 6,390,375 | B2 | * | 5/2002 | Kayanakis .................. 235/492 |
| 6,522,308 | B1 | * | 2/2003 | Mathieu ..................... 343/895 |
| 6,548,888 | B1 | * | 4/2003 | Fidalgo et al. ............. 257/679 |
| 2001/0012682 | A1 | | 8/2001 | Kayanakis et al. ......... 438/585 |

FOREIGN PATENT DOCUMENTS

| FR | 27 64 414 | 3/1998 |
| FR | 27 78 308 | 11/1999 |
| FR | 28 01 707 | 6/2001 |

* cited by examiner

Primary Examiner—Thien M. Le
Assistant Examiner—Lisa M. Caputo
(74) Attorney, Agent, or Firm—James C. Lydon

(57) ABSTRACT

The invention concerns a contactless smart card comprising an antenna (12) on an antenna support (10) made of fibrous material, this antenna consisting of a turn and two contacts (14 and 16) screen printed on the antenna support, a card body (32 and 34) on each side of the antenna support, and a chip (26) provided with contacts (28 and 30), connected to the antenna. This card also features a chip support (20) made of fibrous material having two conductive strips (22 and 24), screen printed on the chip support (20), and to which the contacts (28 and 30) of the chip (26) are connected, the chip support (20) being positioned on the antenna support (10) so that the conductive strips (22 and 24) come into contact with the contacts (14 and 16) of the antenna and connect with the latter, and in such a way that the chip (26) is positioned in a cavity (18), made for this purpose in the antenna support (10).

8 Claims, 2 Drawing Sheets

CONTACTLESS SMART CARD WITH AN ANTENNA SUPPORT AND A CHIP SUPPORT MADE OF FIBROUS MATERIAL

This application claims priority of French patent application 0107782, filed Jun. 14, 2001.

TECHNICAL FIELD

This invention concerns the field of smart cards and more specifically a contactless smart card having an adapter made of paper.

BACKGROUND ART

The smart card sector is undergoing full expansion. These tools, which have become widespread in the form of bank cards and telephone cards, have witnessed a considerable second growth with the development of new technologies and notably the advent of contactless technology. New applications have indeed been invented. For example, in the transportation sector, the contactless smart card was developed as a means of payment for both mass transit and highway systems. The electronic wallet represents yet another application for contactless smart cards as a means of payment. Many companies have also developed identification means for their personnel using contactless smart cards.

The exchange of information between the contactless card and the associated reader is accomplished by remote electromagnetic coupling between an antenna lodged in the contactless card and a second antenna located in the reader. For developing, storing and processing the information, the card is equipped with a contactless chip or electronic module which is connected to the antenna. The antenna and the chip or contactless module are typically located on a dielectric support made of plastic material (polyvinyl chloride (PVC), polyester (PET), polycarbonate (PC) . . . ). The antenna is obtained by chemical copper or aluminum etching on the support or winding of conductive metal wire such as copper.

The card is often monobloc. The antenna support is inserted between two layers of plastic materials (PVC, PET, PC, acrylonitrile-butadiene-styrene (ABS) . . . ) forming the upper and lower card bodies and then heat bonded by hot lamination under pressure. The contactless chip or module is connected to the antenna by an electrically conductive glue or equivalent which enables the ohmic contact to be established.

However, a card of this type has several major drawbacks. The most significant drawback is that the plastic heat bonding operation, implemented during the lamination process, leads to a monobloc card having mediocre mechanical properties in terms of the restitution of absorbed stresses. When the card is subjected to excessive bending and/or twisting stresses, all of the stress applied is transmitted to the contactless chip or electronic module and primarily to the bonding points which make the connections. The mechanical strength of the bonding joints is subjected to great strain which can cause the chip-antenna or contactless module-antenna connection to break. The antenna may also be cut as a result of these mechanical stresses.

Another drawback of traditional contactless smart cards is their cost price. Using an antenna obtained through chemical etching or by coiling metal wire is responsible for a high cost price which is not very compatible with widespread distribution of this type of tool. Furthermore, the use of a contactless electronic module increases this cost price.

In order to counter these drawbacks, another manufacturing process, described in French patent No. 9915019, consists in using a fibrous support such as paper on which the antenna is screen printed using conductive ink. The antenna support is then subjected to a heat treatment to cure the ink. The following steps consist in connecting the chip and the antenna and soldering the card bodies onto the antenna support from both sides by hot press molding, this last step being the lamination step.

The drawback encountered with this method resides in the fact that the rigidity of the chip on which the contacts are glued on the antenna contacts to establish the connection, leads to cracks which form in the conductive ink comprising the antenna during the lamination step. As a result, the connection between the chip and the antenna is sometimes cut, in all cases made fragile, and may break at any time and particularly when external stresses are encountered.

DISCLOSURE OF THE INVENTION

The first object of the invention is thus to mitigate these drawbacks by supplying a contactless smart card which resists the mechanical stresses associated with its use and whose cost price is low owing to the use of inexpensive materials.

A second object of the invention is to supply a contactless smart card whose connections between the antenna and the chip are not fragilized during the card's lamination step.

The invention thus concerns a contactless smart card featuring an antenna on an antenna support made of fibrous material, the antenna consisting of at least one turn of conductive ink and two contacts which are screen printed on the antenna support, each of the card bodies being made up of at least one layer of plastic material, and a chip, provided with contacts connected to the antenna. This card also includes a chip support made of fibrous material featuring two strips of polymerizable conductive ink, screen printed on the chip support, on which are connected the chip's contacts, the chip support being positioned on the antenna support so that the polymerizable conductive ink strips come into contact with the antenna's contacts and connect with them, and so that the chip is positioned in a cavity in the antenna support created for this purpose so that no rigid element of the chip is in contact with the antenna's contacts or the antenna itself. Another purpose of this invention is a smart card manufacturing process, including the steps of:

- manufacturing an antenna consisting in screen printing turns printed using polymerizable conductive ink and two contacts for the antenna on an antenna support made of fibrous material and to subject this antenna support to heat treatment so as to bake and polymerize the conductive ink,
- creating a cavity in the antenna support by a cutout in the latter,
- manufacturing a chip support made of fibrous material by screen printing two strips of polymerizable conductive ink on a support made of fibrous material,
- connecting a chip, featuring contacts on the chip support, so that the chip's contacts are in contact with the strips of polymerizable conductive ink,
- positioning the chip support on the antenna support so that the strips of polymerizable conductive ink are in contact with the contacts of the antenna and so that the chip is located in the cavity, and
- laminating the card body on each side of the antenna support, consisting in welding at least one layer of plastic material to each side of the support by means of hot press molding.

BRIEF DESCRIPTION OF THE FIGURES

The purposes, objects and characteristics of the invention will become more apparent from the following description when taken in conjunction with the accompanying drawings in which.

DETAILED DESCRIPTION OF THE INVENTION

Figure 1:
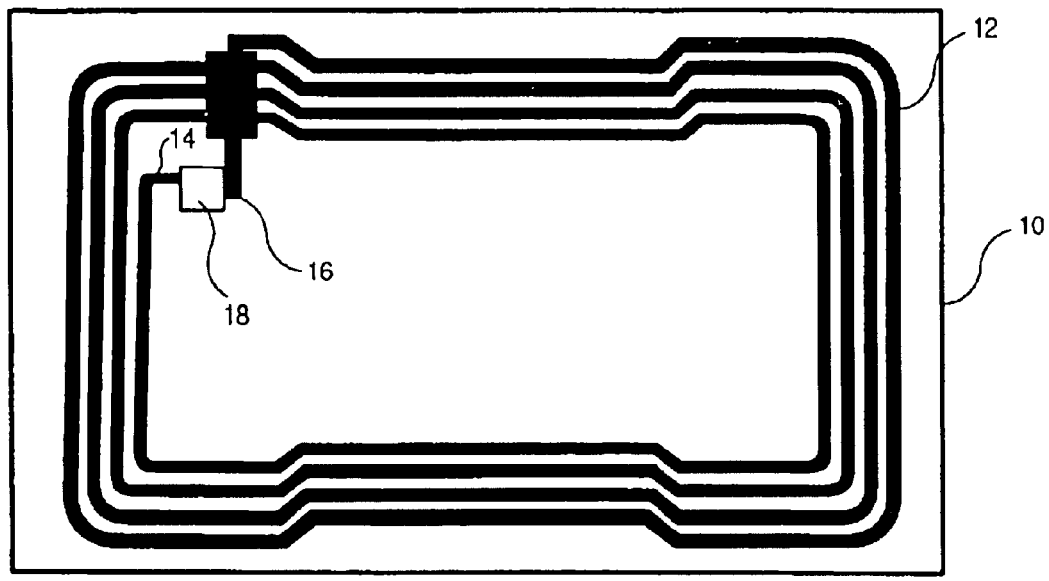
FIG. 1 represents a front view of the smart card's antenna support according to the invention.

The smart card according to the invention includes an antenna support 10, as shown in FIG. 1. This support 10 is made of a fibrous material. This material is preferably paper. An antenna 12 is screen printed on this support. This antenna consists of four concentric turns. Each end of the antenna 10 forms an antenna contact 14 or 16. The turns and the antenna contacts are made using a polymerizable conductive ink. According to a preferred embodiment, this ink is an epoxy ink doped with conductive elements such as silver, copper or carbon. A cavity 18 is created in the antenna support by a cutout in the latter. This cavity is designed to receive the chip.

Figure 2A:
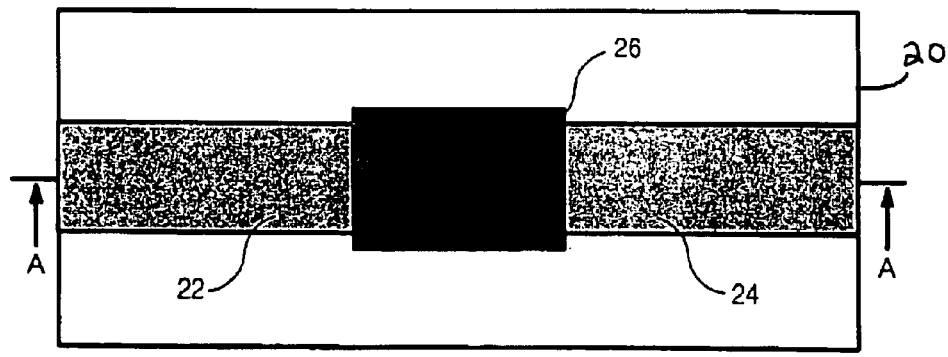
FIGS. 2a and 2b represent a front view of the smart card's chip support according to the invention.
Figure 2B:
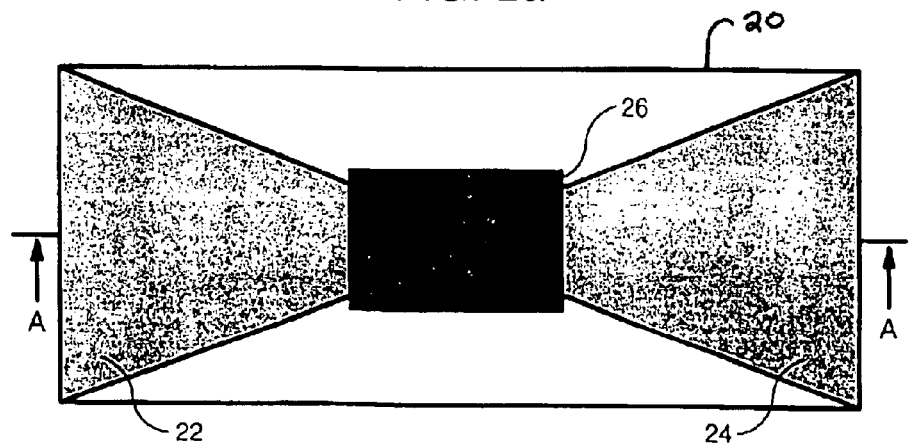

A front view of the chip support 20 is represented in FIGS. 2a and 2b. This support 20 is made of fibrous material. According to a preferred embodiment, this fibrous material is paper. Two strips of polymerizable conductive ink 22 and 24 are screen printed on this support 20. According to a preferred embodiment, this ink is epoxy ink doped with conductive elements such as silver, copper or carbon. The polymerizable ink surface 22 and 24 can be another shape without deviating from the scope of the invention. For example, the surfaces 22 and 24 may be two trapezoids whose long sides are juxtaposed with the opposite outside edges of the support 20 as represented in FIG. 2b. The large surface area of this trapezoidal shape lowers the degree of precision of the operation which consists in placing the chip support on the antenna support in order to establish the connection and thus to increase the production speed of this operation and to thus obtain enhanced output and lower machine costs. A chip 26 provided with contacts is positioned on the support 20.

Figure 3:
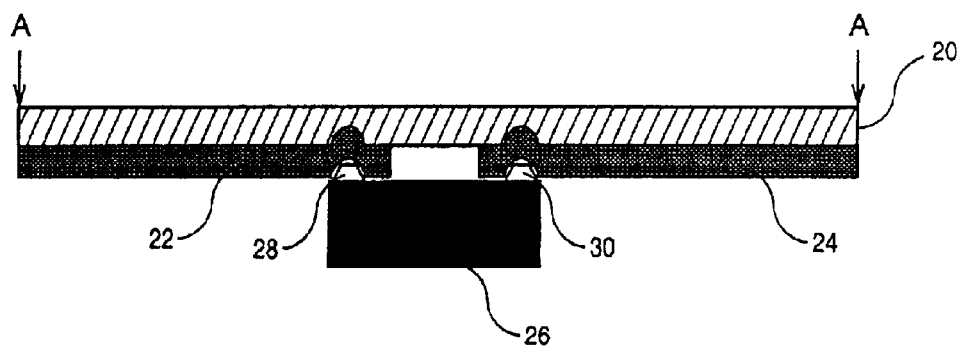
FIG. 3 is a cross sectional view along axis A—A of the chip support represented in FIG. 2.

FIG. 3 represents a longitudinal cross-sectional view of the chip support 20 represented in FIG. 2, along axis A—A. It can be seen that the chip 26 is connected to the support 20 so that the contacts 28 and 30 are in contact with the strips of polymerizable conductive ink 22 and 24. Several methods can be used to connect the chip 26 to the support 20.

According to an initial embodiment, once the chip 26 is positioned so that the contacts 28 and 30 are facing the strips of conductive ink 22 and 24, pressure is applied to the chip so that its contacts deform the chip support 20 and the strips of polymerizable conductive ink 22 and 24, as a result of the pressure. The chip support 20 and the strips of polymerizable conductive ink 22 and 24 keep their deformed shapes after the pressure is released, then enabling a large contact surface to be obtained between the chip contacts and the strips of conductive ink.

According to a second embodiment, the strips of polymerizable conductive ink 22 and 24 are coated with a conductive glue. Then, the chip 26 is positioned on the chip support 20 so that the contacts 28 and 30 of said chip are buried in said conductive glue, facing the strips of polymerizable conductive ink 22 and 24.

Figure 4:
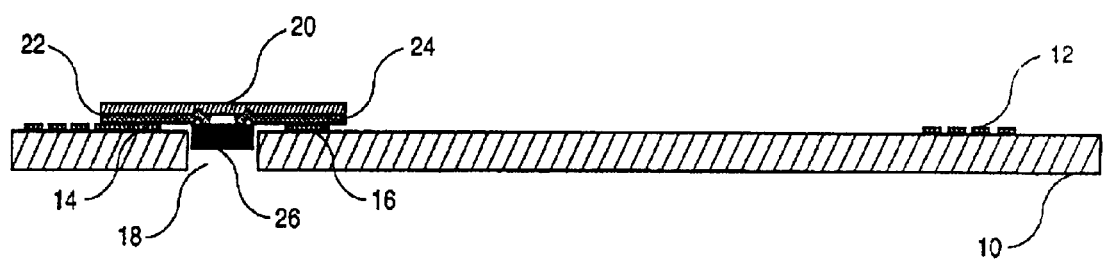
FIG. 4 represents a longitudinal cross section of the antenna support bearing the chip support.

The chip support 20 thus obtained is positioned on the antenna support 10 in such a way that the chip 26 is contained in the cavity 18, as shown in FIG. 4. The strips of polymerizable conductive ink 22 and 24 come into contact with the antenna contacts 14 and 16. The chip 26 is then connected to the antenna 12. When the fabrication of the card is completed, this connection made without conductive glue is definitive. The long length of the polymerizable conductive ink strips 22 and 24 enable longitudinal displacement of the chip support 20 on the antenna support 10 as required without affecting the connection between the chip and the antenna. Transverse movement is not possible once fabrication of the card is completed. Nevertheless, in an attempt to perfect the technique and to improve the contact and prevent the chip support 20 from moving, a layer of conductive glue may be applied between the strips of polymerizable conductive ink 22 and 24 and the antenna's contacts 14 and 16.

Figure 5:
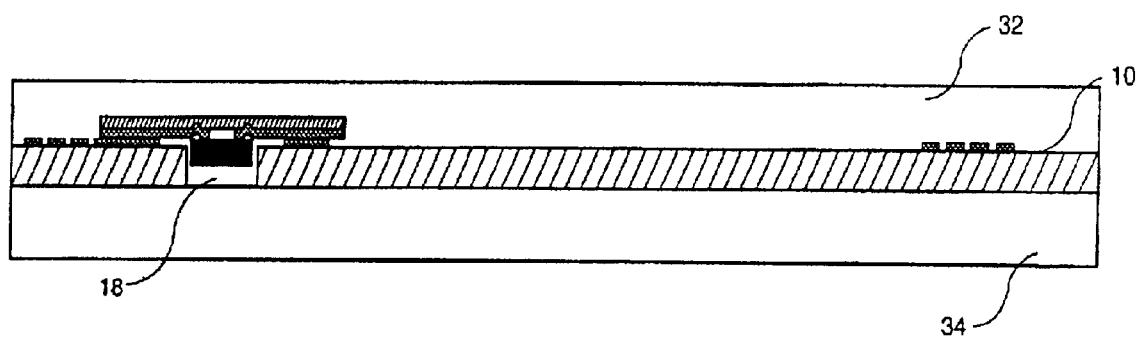
FIG. 5 shows a longitudinal sectional view of the smart card according to the invention.

A cross-sectional view of the smart card in its final configuration is shown in FIG. 5. A layer of plastic material was laminated on each side of the antenna support 10, bearing the chip support 20, thus forming the card bodies 32 and 34. This lamination is preferably performed by hot press molding. The plastic material used for the card bodies is polyvinyl chloride (PVC), polyester (PET, PETG), polycarbonate (PC) or acrylonitrile-butadiene-styrene (ABS). According to a preferred embodiment, these card bodies are made of PVC. According to this embodiment, each card body consists of one single layer. However, each card body may consist of several layers of identical or different plastic material.

The smart card thus obtained offers excellent mechanical resistance due to the fact that the antenna support and the chip support are made of the same very flexible fibrous material. As such, contrary to contactless cards having a metal module, no mechanical stress is transmitted to the antenna support which may lead to antenna disconnection. The only stress point which exists in this card is the chip itself owing to its rigid structure. However, as the surface area of the chip is very small, these stresses are also small. Furthermore, as the chip is positioned on a specific chip support and lodged in a cavity made in the antenna support, it is not in direct contact with the latter thus it is not in contact with the antenna turns or contacts, which reduces the mechanical stress and notably the shearing stresses which could occur on the antenna contacts or on the antenna itself during the lamination operation. This smart card thus offers great reliability, despite the use of inexpensive materials which enable cards to be produced at a very low cost price.

What is claimed is:

1. A contactless smart card comprising
an antenna on an antenna support made of fibrous material, said antenna comprising at least one turn of conductive ink and two contacts which are screen printed on said antenna support, each of said card bodies being made up of at least one layer of plastic material, and a chip provided with contacts connected to the antenna,
wherein said card also includes a chip support made of fibrous materials including two strips of polymerizable conductive ink screen printed on said chip support, and to which are connected said contacts of the chip, said chip support being positioned on said antenna support so that said strips of polymerizable conductive ink come into contact with said antenna contacts and connect to the latter, such that said chip is positioned in a cavity in said antenna support, so that no rigid element of the chip comes into contact with said antenna contacts or said antenna.

2. The smart card of claim 1, wherein the chip's connection to the strips of polymerizable conductive ink is made by burying said chip contacts in said strips of conductive ink and in said chip support.

3. The smart card of claim 1, wherein the chip's connection to the strips of polymerizable conductive ink is obtained through a layer of conductive glue placed between the chip's contacts and said strips of polymerizable conductive ink.

4. The smart card of claim 1, wherein said fibrous material is paper.

5. The smart card of claim 1, wherein said strips of polymerizable conductive ink are connected to the antenna contacts by means of a layer of conductive glue.

6. The smart card of claim 1, wherein the plastic material forming the card bodies is a member selected from the group consisting of polyvinyl chloride (PVC), polyester (PET, PETG), polycarbonate (PC) and acrylonitrile-butadiene-styrene (ABS).

7. The smart card of claim 1, wherein said polymerizable, conductive ink is an epoxy ink doped with a conductive element.

8. A smart card manufacturing method comprising:

manufacturing an antenna by screen printing turns printed using polymerizable conductive ink and two contacts of said antenna on an antenna support made of fibrous material and to subject this antenna support to heat treatment so as to bake and polymerize the conductive ink, creating a cavity in said antenna support by a cutout in the latter, manufacturing a chip support made of fibrous material by screen printing two strips of polymerizable conductive ink on a support made of fibrous material, connecting a chip, featuring contacts on said chip support, such that said contacts are in contact with the strips of polymerizable conductive ink, positioning the chip support on the antenna support so that said strips of polymerizable conductive ink are in contact with said contacts of the antenna and so that said chip is placed in the cavity so that no rigid element of the chip comes into contact with said antenna contacts or said antenna, and laminating card bodies on each side of said antenna support, consisting in welding a layer of plastic material on each side of said support by hot press molding and to perfectly connect said chip with the antenna.

* * * * *